United States Patent
Kim

(10) Patent No.: US 8,907,451 B2
(45) Date of Patent: Dec. 9, 2014

(54) SEMICONDUCTOR CHIP AND SEMICONDUCTOR APPARATUS WITH EMBEDDED CAPACITOR

(71) Applicant: SK Hynix Inc., Icheon-si Gyeonggi-do (KR)

(72) Inventor: Jong Hoon Kim, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/844,210

(22) Filed: Mar. 15, 2013

(65) Prior Publication Data

US 2014/0175605 A1 Jun. 26, 2014

(30) Foreign Application Priority Data

Dec. 21, 2012 (KR) .......................... 10-2012-0150359

(51) Int. Cl.

| | |
|---|---|
| H01L 21/02 | (2006.01) |
| H01L 23/64 | (2006.01) |
| H01L 25/065 | (2006.01) |
| H01L 23/522 | (2006.01) |
| H01L 49/02 | (2006.01) |
| H01L 23/48 | (2006.01) |
| H01L 23/31 | (2006.01) |

(52) U.S. Cl.
CPC ... *H01L 23/5223* (2013.01); *H01L 2225/06565* (2013.01); *H01L 23/481* (2013.01); *H01L 23/642* (2013.01); *H01L 2225/06517* (2013.01); *H01L 2224/0401* (2013.01); *H01L 2224/05548* (2013.01); *H01L 2225/06513* (2013.01); *H01L 25/0657* (2013.01); *H01L 23/3128* (2013.01); *H01L 28/40* (2013.01); *H01L 2224/05572* (2013.01); *H01L 2224/16145* (2013.01); *H01L 2224/16146* (2013.01); *H01L 2224/16225* (2013.01); *H01L 2924/15311* (2013.01); *H01L 2225/06541* (2013.01); *H01L 2224/05569* (2013.01)

USPC ........... 257/532; 257/686; 257/690; 257/724; 257/777; 257/E21.241

(58) Field of Classification Search
CPC ......... H01L 27/00; H01L 28/00; H01L 29/00; H01L 21/00
USPC .......... 257/532, 686, 690, 724, 777, E21.241, 257/E23.142, E23.144, E21.648
See application file for complete search history.

(56) References Cited

U.S. PATENT DOCUMENTS

| | | | | |
|---|---|---|---|---|
| 7,335,995 | B2 * | 2/2008 | Pflughaupt et al. | ........... 257/779 |
| 8,164,158 | B2 * | 4/2012 | Lin | ................. 257/531 |

(Continued)

FOREIGN PATENT DOCUMENTS

| | | |
|---|---|---|
| KR | 100535181 B1 | 12/2005 |
| KR | 100669963 B1 | 1/2007 |
| KR | 10095463 B1 | 4/2010 |

*Primary Examiner* — Telly Green
(74) *Attorney, Agent, or Firm* — William Park & Associates Patent Ltd.

(57) ABSTRACT

A semiconductor chip includes a semiconductor substrate having one and the other surfaces and formed with a plurality of semiconductor devices; an internal wiring layer having multi-layered internal wiring lines which are formed over the one surface and are electrically connected with the plurality of semiconductor devices, an uppermost internal wiring line among the internal wiring lines being formed with a power supply pad and a ground pad; a dielectric layer formed over the uppermost internal wiring line in such a way as to expose the power supply pad and the ground pad; an external connection reinforcing line formed over the power supply pad or the ground pad which is exposed, and extending onto the dielectric layer; and an embedded capacitor constituted by the external connection reinforcing line, and the dielectric layer and a portion of the uppermost internal wiring line which correspond to the external connection reinforcing line.

19 Claims, 6 Drawing Sheets

(56) References Cited

U.S. PATENT DOCUMENTS

| | | | |
|---|---|---|---|
| 8,513,812 B2 * | 8/2013 | Lin | 257/773 |
| 2011/0062549 A1 * | 3/2011 | Lin | 257/531 |
| 2011/0186978 A1 * | 8/2011 | Kim et al. | 257/686 |
| 2012/0175779 A1 * | 7/2012 | Lin | 257/773 |
| 2013/0082352 A1 * | 4/2013 | Kim et al. | 257/532 |
| 2013/0087887 A1 * | 4/2013 | Kim et al. | 257/532 |

* cited by examiner

SEMICONDUCTOR CHIP AND SEMICONDUCTOR APPARATUS WITH EMBEDDED CAPACITOR

CROSS-REFERENCE TO RELATED APPLICATIONS

The present application claims priority under 35 U.S.C 119(a) to Korean Patent Application Number 10-2012-0150359 filed in the Korean Intellectual Property Office on Dec. 21, 2012, which is incorporated herein by reference in its entirety.

FIELD OF THE INVENTION

The present invention relates generally to a semiconductor technology, and more particularly to an embedded capacitor, and a semiconductor chip or apparatus having the same.

BACKGROUND OF THE INVENTION

A large amount of electrical noise is produced when the semiconductor devices formed in a semiconductor chip are operated at a high speed with a low operating voltage. This deteriorates the electrical reliability of the semiconductor devices formed in a semiconductor chip.

BRIEF SUMMARY OF THE INVENTION

An embodiment of the present invention is directed to an embedded capacitor capable of improving electrical reliability.

Also, an embodiment of the present invention is directed to a semiconductor chip and a semiconductor apparatus which have an embedded capacitor, thereby improving electrical reliability.

In one embodiment of the present invention, a semiconductor chip includes: a semiconductor substrate having one surface and the other surface which faces away from the one surface, and formed with a plurality of semiconductor devices; an internal wiring layer having multi-layered internal wiring lines which are formed over the one surface and are electrically connected with the plurality of semiconductor devices, an uppermost internal wiring line among the internal wiring lines being formed with a power supply pad and a ground pad; a dielectric layer formed over the uppermost internal wiring line in such a way as to expose the power supply pad and the ground pad; an external connection reinforcing line formed over the power supply pad or the ground pad which is exposed, and extending onto the dielectric layer; and an embedded capacitor constituted by the external connection reinforcing line, and the dielectric layer and a portion of the uppermost internal wiring line which correspond to the external connection reinforcing line.

The dielectric layer may include a dielectric substance with a dielectric constant equal to or greater than 4.

The external connection reinforcing line may be electrically connected with the power supply pad, and the portion of the uppermost internal wiring line, which is included in the embedded capacitor, may be electrically connected with the ground pad. Meanwhile, the external connection reinforcing line may be electrically connected with the ground pad, and the portion of the uppermost internal wiring line, which is included in the embedded capacitor, may be electrically connected with the power supply pad.

The semiconductor chip may further include a plurality of signal transfer pads formed in the uppermost internal wiring line and are exposed through the dielectric layer. Besides, the semiconductor chip may further include connection reinforcing lines respectively formed over the plurality of signal transfer pads and the power supply pad or the ground pad over which the external connection reinforcing line is not formed.

In another embodiment of the present invention, a semiconductor apparatus includes: a semiconductor chip including a semiconductor substrate having one surface and the other surface which faces away from the one surface, and formed with a plurality of semiconductor devices, an internal wiring layer having multi-layered internal wiring lines which are formed over the one surface and are electrically connected with the plurality of semiconductor devices, an uppermost internal wiring line among the internal wiring lines being formed with a power supply pad and a ground pad, a dielectric layer formed over the uppermost internal wiring line in such a way as to expose the power supply pad and the ground pad, an external connection reinforcing line formed over the power supply pad or the ground pad which is exposed, and extending onto the dielectric layer, and an embedded capacitor constituted by the external connection reinforcing line, and the dielectric layer and a portion of the uppermost internal wiring line which correspond to the external connection reinforcing line; and external connection terminals respectively electrically connected with the power supply pad and the ground pad.

The dielectric layer may include a dielectric substance with a dielectric constant equal to or greater than 4.

The external connection reinforcing line may be electrically connected with the power supply pad, and the portion of the uppermost internal wiring line, which is included in the embedded capacitor, may be electrically connected with the ground pad. Meanwhile, the external connection reinforcing line may be electrically connected with the ground pad, and the portion of the uppermost internal wiring line, which is included in the embedded capacitor, may be electrically connected with the power supply pad.

The semiconductor chip may further include a plurality of signal transfer pads formed in the uppermost internal wiring line and are exposed through the dielectric layer. Besides, the semiconductor chip may further include connection reinforcing lines respectively formed over the plurality of signal transfer pads and the power supply pad or the ground pad over which the external connection reinforcing line is not formed.

The semiconductor apparatus may further include a structural body electrically connected with the semiconductor chip through the external connection terminals. The structural body may include any one of a printed circuit board, an interposer and a semiconductor package.

The semiconductor apparatus may further include redistribution lines formed over the ground pad, the power supply pad and the dielectric layer, and respectively electrically connected with the ground pad and the power supply pad; and a protective layer formed over the dielectric layer including the external connection reinforcing line and the redistribution lines in such a way as to expose portions of the redistribution lines, wherein the external connection terminals are formed over the portions of the redistribution lines which are exposed through the protective layer.

The semiconductor chip may further include a plurality of through electrodes which pass through the semiconductor substrate and are electrically connected with the internal wiring lines, and a plurality of semiconductor chips may be stacked such that they are electrically connected with one another by the medium of the plurality of through electrodes and the external connection terminals.

In another embodiment of the present invention, an embedded capacitor formed in a semiconductor chip includes: a first electrode as a portion of an uppermost internal wiring line which is an uppermost layer of an internal wiring layer formed over one surface of a semiconductor substrate and including multi-layered internal wiring lines electrically connected with a plurality of semiconductor devices, the first electrode being electrically connected with a power supply pad or a ground pad; a dielectric area corresponding to the first electrode in a dielectric layer which is formed over the uppermost internal wiring line and exposes the power supply pad and the ground pad; and a second electrode formed over the power supply pad or the ground pad which is exposed and is not connected with the first electrode, in such a way as to extend onto the dielectric area.

The dielectric area may include a dielectric substance with a dielectric constant equal to or greater than 4, and the dielectric layer may include a dielectric substance with a dielectric constant equal to or greater than 4.

DESCRIPTION OF SPECIFIC EMBODIMENTS

Hereafter, various embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
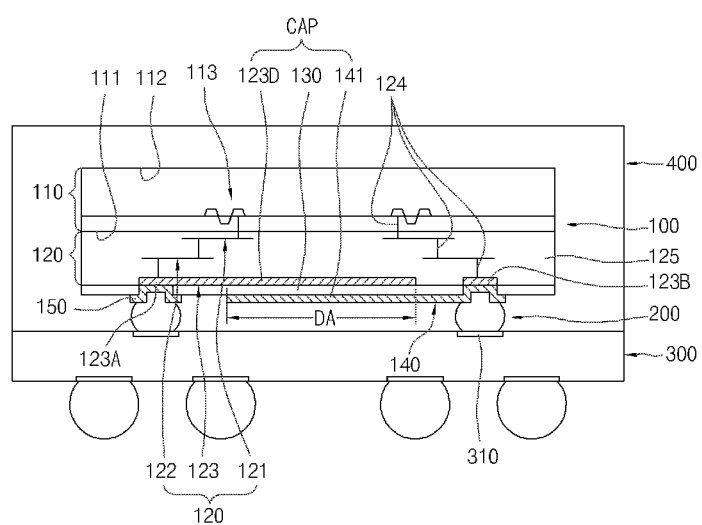
FIG. 1 is a cross-sectional view illustrating a semiconductor apparatus in accordance with an embodiment of the present invention.
Figure 2:
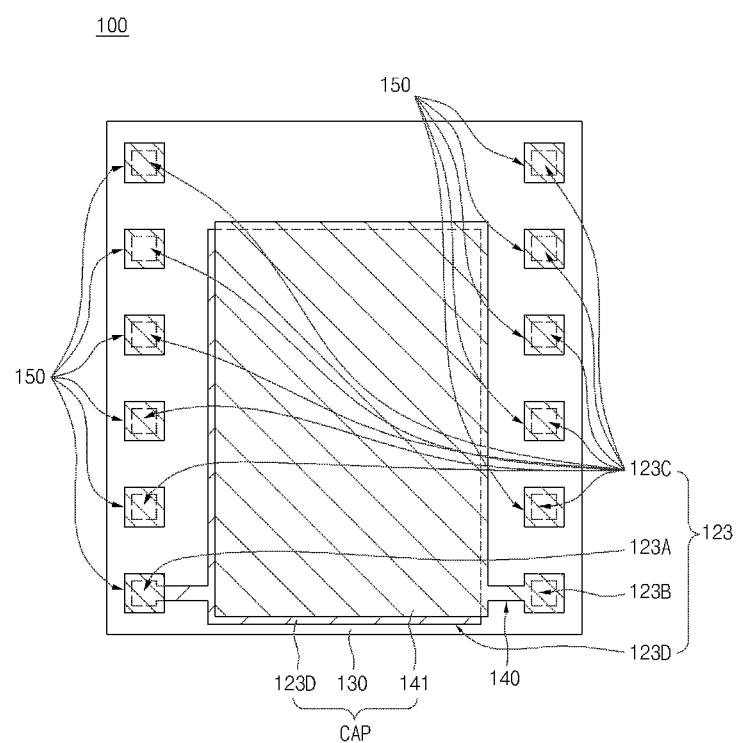
FIG. 2 is a plan view illustrating the semiconductor chip shown in FIG. 1.

FIG. 1 is a cross-sectional view illustrating a semiconductor apparatus in accordance with an embodiment of the present invention, and FIG. 2 is a plan view illustrating the semiconductor chip shown in FIG. 1.

Referring to FIG. 1, a semiconductor apparatus in accordance with an embodiment of the present invention includes a semiconductor chip 100. The semiconductor apparatus in accordance with an embodiment of the present invention may further include external connection terminals 200, a structural body 300, and a molding part 400.

Referring to FIGS. 1 and 2, a semiconductor chip 100 includes a semiconductor substrate 110, an internal wiring layer 120, a dielectric layer 130, an external connection reinforcing line 140, and connection reinforcing lines 150.

As shown in FIG. 1, semiconductor substrate 110 according to an embodiment of the invention includes a plurality of semiconductor devices 113. Each of the semiconductor devices 113 may include, for example, an image sensor, a memory semiconductor, a system semiconductor, a passive device, an active device, a sensor semiconductor, etc. Also as shown in FIG. 1, one surface of the semiconductor substrate 110 is labeled with 111 and will be referred to as the first surface 111, and the surface that on the opposite side of the surface 111 is labeled with 112 and will be referred to as the second surface 112.

The internal wiring layer 120 may be formed on the first surface 111 of the semiconductor substrate 110 and includes multi-layered internal wiring lines 121, 122, and 123, among others, which may be formed at different layers. The semiconductor devices 113 is electrically connected to the internal wiring lines 121, 122, and 123 by the conductive vias 124, and the internal wiring lines 121, 122, and 123 may also be connected to each other by the conductive vias 124. The internal wiring lines 121, 122, and 123 formed a layer are insulated and isolated an insulation layer 125 from those formed in different layers.

The uppermost internal wiring line 123 among the internal wiring lines 121, 122, and 123, as shown in FIG. 1, is exposed to the upper surface of the internal wiring layer 120, and the uppermost internal wiring line 123 includes: a power supply pad 123A for inputting of a power supply voltage, a ground pad 123B for inputting of a ground voltage, signal transfer pads 123C for inputting and outputting of signals, and a first electrode 123D. In an embodiment of the present invention, the first electrode 123D is electrically connected to the power supply pad 123A.

The dielectric layer 130 is formed on the insulation layer 125 including the uppermost internal wiring line 123 in a way that exposes the power supply pad 123A, the ground pad 123B, and the signal transfer pads 123C. The dielectric layer 130 has a dielectric area DA corresponding to a portion of the first electrode 123D and comprises a dielectric substance with a dielectric constant of 4 or greater.

The external connection reinforcing line 140 is formed on the exposed portion of the ground pad 123B (not covered by the dielectric layer 130), so as to make electrical connection therebetween. The external connection reinforcing line 140 includes a second electrode 141 that is formed to extend onto the dielectric area DA of the dielectric layer 130.

It has been described that the external connection reinforcing line 140 may be electrically connected to the ground pad 123B and the first electrode 123D of the uppermost internal wiring line 123 may be electrically connected to the power supply pad 123A in accordance with an embodiment of the present invention, it should also be readily understood that the external connection reinforcing line 140 may be electrically connected to the power supply pad 123A and that the first electrode 123D of the uppermost internal wiring line 123 may be electrically connected to the ground pad 123B.

An embedded capacitor CAP is therefore formed by the second electrode 141 of the external connection reinforcing line 140, the dielectric layer 130 of the dielectric area DA, and the first electrode 123D of the uppermost internal wiring line 123.

The connection reinforcing lines 150 are respectively formed on the power supply pad 123A and the plurality of signal transfer pads 123C. In case the external connection reinforcing line 140 is formed on the power supply pad 123A, the connection reinforcing lines 150 may be formed not on the power supply pad 123A but on the ground pad 123B.

The external connection terminals 200 are formed on the external connection reinforcing line 140 and the connection reinforcing lines 150. The external connection terminals 200 are electrically connected, respectively, to the power supply pad 123A, the ground pad 123B, and the plurality of signal transfer pads 123C. Each of the external connection terminals 200 may include any one of a bump and a solder ball.

The structural body 300 has connection electrodes 310, which are electrically connected, respectively, to the external connection terminals 200. In an embodiment of the present invention, the structural body 300 may be formed as a printed circuit board.

It should also be readily understood in accordance with an embodiment of the present invention that the structural body 300, in addition to being a printed circuit board, may also be an interposer or a semiconductor package.

The molding part 400 is formed on the upper surface of the structural body 300 to mold the semiconductor chip 100 therein. The molding part 400 may be formed of an epoxy molding compound (EMC).

Figure 3:
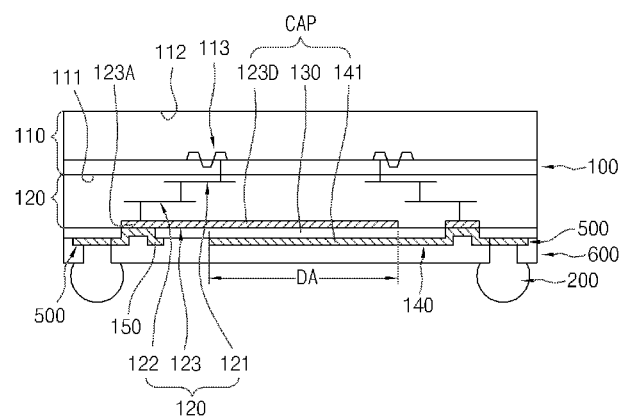
FIG. 3 is a cross-sectional view illustrating a semiconductor apparatus in accordance with an embodiment of the present invention.

Referring to FIG. 3, a semiconductor apparatus in accordance with an embodiment of the present invention includes a semiconductor chip 100 and further includes redistribution lines 500, a protective layer 600, and external connection terminals 200.

The semiconductor chip 100 according to an embodiment of the present invention as shown in FIG. 3 share certain similar components with the semiconductor chip 100 according to an embodiment described above with reference to FIGS. 1 and 2. Therefore, description of the similar components for the semiconductor chip 100 will not be repeated herein, and the same terms and reference numerals will be used in FIG. 3 to refer to the same components shown in FIGS. 1 and 2.

The redistribution lines 500 are formed on a dielectric layer 130 and are electrically connected to a power supply pad 123A, a ground pad 123B, and signal transfer pads 123C.

The protective layer 600 is formed on the dielectric layer 130 including an external connection reinforcing line 140, connection reinforcing lines 150 and the redistribution lines 500, in a way that exposes portions of the redistribution lines 500. The external connection terminals 200 are attached to the portions of the redistribution lines 500, which are exposed through the protective layer 600.

Figure 4:
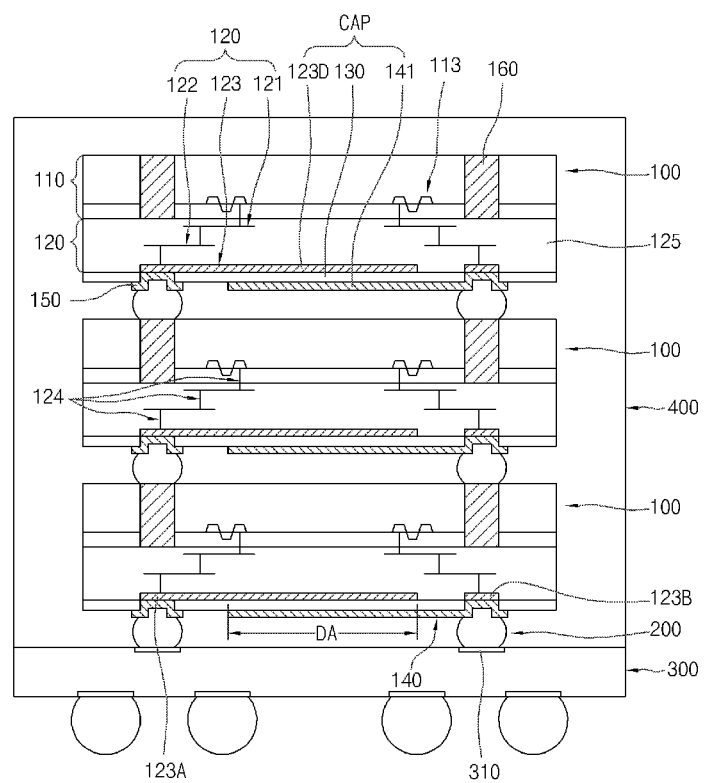
FIG. 4 is a cross-sectional view illustrating a semiconductor apparatus in accordance with an embodiment of the present invention.

Now referring to FIG. 4, a semiconductor apparatus in accordance with an embodiment of the present invention includes a plurality of semiconductor chips 100 and may further include external connection terminals 200, a structural body 300, and a molding part 400.

The semiconductor chips 100 according an embodiment of the present invention as shown in FIG. 4 may be same as the semiconductor chips 100 shown in FIGS. 1-2 but also has an additional construction that includes a plurality of through electrodes 160. That is, the semiconductor chips 100 (except the through electrodes 160) according to an embodiment shown in FIG. 4 has is substantially the same construction as the semiconductor chip 100 described above with reference to FIGS. 1 and 2. Therefore, repeated descriptions for the same component parts will be omitted herein, and the same terms and the same reference numerals will be used to refer to the same component parts.

The plurality of through electrodes 160 pass through the first surface 111 and the second surface 112 of a semiconductor substrate 110, and are electrically connected with internal wiring lines 121, 122, and 123 of an internal wiring layer 120.

The external connection terminals 200 are formed on connection reinforcing lines 150 and an external connection reinforcing line 140, and are respectively electrically connected to a power supply pad 123A, a ground pad 123B and a plurality of signal transfer pads 123C. Each of the external connection terminals 200 may include any one of a bump and a solder ball.

A plurality of semiconductor chips 100 are stacked such that they are electrically connected with one another by the medium of the through electrodes 160 and the external connection terminals 200.

The structural body 300 includes connection electrodes 310 that are electrically connected to the external connection terminals 200, which are formed on the connection reinforcing lines 150 and the external connection reinforcing line 140 of the lowermost semiconductor chip 100 among the plurality of stacked semiconductor chips 100. According to an embodiment of the present invention, the structural body 300 may be formed as a printed circuit board; however, it should also be readily understood that the structural body 300 may be any one of an interposer and a semiconductor package.

The molding part 400 is formed on the upper surface of the structural body 300 including the stacked semiconductor chips 100, and molds the semiconductor chips 100. The molding part 400 may be formed of an epoxy molding compound (EMC).

The embedded capacitor CAP in accordance with an embodiment of the present invention acts to stabilize the supply of power and ground voltages that are provided to a semiconductor chip and thus reduces noise and improves the electrical reliability of the semiconductor apparatus. Further, in accordance with an embodiment of the present invention, the embedded capacitor is formed by using the wirings and the insulating layers in a semiconductor chip, and thus there is no need for extra processes for forming the emdedded capacitor is not arise.

The semiconductor apparatus according to the embodiments described above may be applied to various electronic apparatuses.

Figure 5:
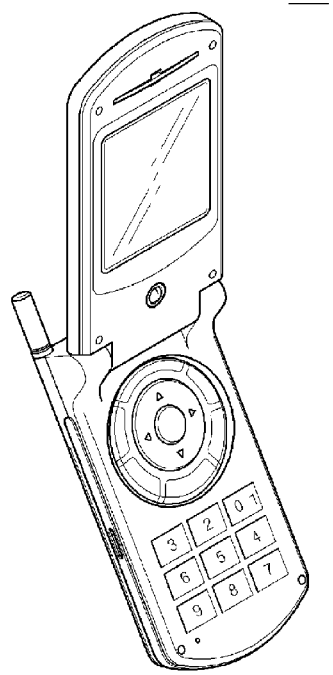
FIG. 5 is a perspective view illustrating an electronic apparatus having the semiconductor apparatus according to an embodiment of the present invention.

FIG. 5 is a perspective view illustrating an example of an electronic apparatus 1000 such as a portable phone that may be equipped with the semiconductor apparatus according to an embodiment of the present invention as described above.

Referring to FIG. 5, the electronic apparatus 1000 such as a portable phone having the semiconductor apparatus according to an embodiment of the present invention retains the improved characteristics of electrical reliability and the advantages in improved performance and reliability characteristics of the electronic apparatus 1000. The electronic apparatus 1000 is not limited just to a portable phone as shown in FIG. 5 but may also include various other types of electronic appliances such as, for example, a mobile electronic appliance, a laptop computer, a notebook computer, a portable multimedia player (PMP), an MP3 player, a camcorder, a web tablet, a wireless phone, a navigator, a personal digital assistant (PDA), etc.

Figure 6:
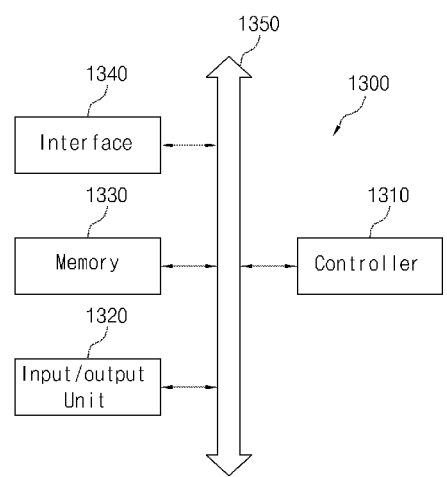
FIG. 6 is a block diagram showing an example of an electronic system having the semiconductor apparatus according to an embodiment of the present invention.

FIG. 6 is a block diagram showing an example of an electronic system having the semiconductor apparatus according to an embodiment of the present invention.

Referring to FIG. 6, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data can move. For example, the controller 1310 may include one or more of a microprocessor, a digital signal processor, a microcontroller, and the logic devices capable of performing the same or other functions as these components. The controller 1310 and the memory 1330 may include the semiconductor apparatus according to an embodiment of the present invention. The input/output unit 1320 may include one or more of a keypad, a keyboard, a display device, etc. The memory 1330 may be any device for storing data. The memory 1330 may store data and/or commands to be executed by the controller 1310, and the likes. The memory 1330 may include a volatile memory device and/or a nonvolatile memory device. The memory 1330 may be a flash memory. For example, a flash memory to which the technology of the present invention is applied may be mounted to an information processing system such as a mobile terminal or a desk top computer. The flash memory may be constituted by a solid state drive (SSD). In this case, the electronic system 1300 will stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person of ordinary skill in the art will readily appreciate that the electronic system 1300 may be additionally provided with an application chipset, a camera image processor (CIS), an input/output unit, etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
    a semiconductor substrate having a first surface and a second surface and comprising a plurality of semiconductor devices;
    an internal wiring layer comprising multi-layered internal wiring lines formed over the first surface and electrically connected to the plurality of semiconductor devices, wherein an uppermost internal wiring line among the internal wiring lines is formed with a power supply pad and a ground pad;
    a dielectric layer formed directly on the uppermost internal wiring line while exposing the power supply pad and the ground pad;
    an external connection reinforcing line formed over the power supply pad or the ground pad which is exposed, and extending onto the dielectric layer; and
    an embedded capacitor comprising the external connection reinforcing line, the dielectric layer, and a portion of the uppermost internal wiring line which correspond to the external connection reinforcing line.

2. The semiconductor chip according to claim 1, wherein the dielectric layer comprises a dielectric substance with a dielectric constant equal to or greater than 4.

3. The semiconductor chip according to claim 1, wherein the external connection reinforcing line is electrically connected to the power supply pad, and the portion of the uppermost internal wiring line, which is included in the embedded capacitor, is electrically connected to the ground pad.

4. The semiconductor chip according to claim 1, wherein the external connection reinforcing line is electrically connected to the ground pad, and a portion of the uppermost internal wiring line, which is included in the embedded capacitor, is electrically connected to the power supply pad.

5. The semiconductor chip according to claim 1, further comprising:
    a plurality of signal transfer pads formed in the uppermost internal wiring line and exposed through the dielectric layer.

6. The semiconductor chip according to claim 5, further comprising:
    connection reinforcing lines formed over the plurality of signal transfer pads and the power supply pad or the ground pad over which the external connection reinforcing line is not formed.

7. A semiconductor apparatus comprising:
    a semiconductor chip comprising:
        a semiconductor substrate having a first surface and a second surface and comprising a plurality of semiconductor devices;
        an internal wiring layer comprising multi-layered internal wiring lines formed over the first surface and are electrically connected to the plurality of semiconductor devices, wherein an uppermost internal wiring line among the internal wiring lines is formed with a power supply pad and a ground pad;
        a dielectric layer formed directly on the uppermost internal wiring line while exposing the power supply pad and the ground pad;
        an external connection reinforcing line formed over the power supply pad or the ground pad which is exposed, and extending onto the dielectric layer; and
        an embedded capacitor comprising the external connection reinforcing line, the dielectric layer, and a portion of the uppermost internal wiring line which correspond to the external connection reinforcing line; and
    external connection terminals electrically connected to the power supply pad and the ground pad respectively.

8. The semiconductor apparatus according to claim 7, wherein the dielectric layer comprises a dielectric substance with a dielectric constant equal to or greater than 4.

9. The semiconductor apparatus according to claim 7, wherein the external connection reinforcing line is electrically connected to the power supply pad, and the portion of the uppermost internal wiring line, which is included in the embedded capacitor, is electrically connected to the ground pad.

10. The semiconductor apparatus according to claim 7, wherein the external connection reinforcing line is electrically connected to the ground pad, and the portion of the uppermost internal wiring line, which is included in the embedded capacitor, is electrically connected to the power supply pad.

11. The semiconductor apparatus according to claim 7, wherein the semiconductor chip further comprises a plurality of signal transfer pads formed in the uppermost internal wiring line and are exposed through the dielectric layer.

12. The semiconductor apparatus according to claim 11, wherein the semiconductor chip further comprises connection reinforcing lines respectively formed over the plurality of signal transfer pads and the power supply pad or the ground pad over which the external connection reinforcing line is not formed.

13. The semiconductor apparatus according to claim 7, further comprising:
    a structural body electrically connected to the semiconductor chip through the external connection terminals.

14. The semiconductor apparatus according to claim 13, wherein the structural body comprises one of a printed circuit board, an interposer, and a semiconductor package.

15. The semiconductor apparatus according to claim 7, further comprising:
    redistribution lines formed over the ground pad, the power supply pad, and the dielectric layer, wherein the redistribution lines are electrically connected to the ground pad and the power supply pad, respectively; and a protective layer formed over the dielectric layer including the external connection reinforcing line and the redistribution lines while exposing portions of the redistribution lines, wherein the external connection terminals are mounted on the portions of the redistribution lines which are exposed through the protective layer.

16. The semiconductor apparatus according to claim 7, wherein the semiconductor chip further comprises a plurality of through electrodes which pass through the semiconductor substrate and are electrically connected to the internal wiring lines, and wherein a plurality of semiconductor chips are stacked such that they are electrically connected to one another by the medium of the plurality of through electrodes and the external connection terminals.

17. An embedded capacitor, comprising:

a first electrode comprising a portion of an uppermost internal wiring line of a semiconductor chip which is an uppermost layer of an internal wiring layer of the semiconductor chip formed over a first surface of a semiconductor substrate of the semiconductor chip and including multi-layered internal wiring lines electrically connected to a plurality of semiconductor devices of the semiconductor chip, wherein the first electrode is electrically connected to a power supply pad or a ground pad of the semiconductor chip;

a dielectric area corresponding to the first electrode in a dielectric layer of the semiconductor chip, wherein the dielectric layer is formed directly on the uppermost internal wiring line while exposing the power supply pad and the ground pad; and a second electrode formed over the power supply pad or the ground pad which is exposed and is not connected to the first electrode so as to extend onto the dielectric area.

18. The embedded capacitor according to claim 17, wherein the dielectric area comprises a dielectric substance with a dielectric constant equal to or greater than 4.

19. The embedded capacitor according to claim 17, wherein the dielectric layer comprises a dielectric substance with a dielectric constant equal to or greater than 4.

* * * * *